United States Patent [19]
Kelley

[11] Patent Number: 5,278,837
[45] Date of Patent: Jan. 11, 1994

[54] MULTIPLE USER DIGITAL RECEIVER APPARATUS AND METHOD WITH COMBINED MULTIPLE FREQUENCY CHANNELS

[75] Inventor: Edwin A. Kelley, Los Angeles, Calif.

[73] Assignee: Hughes Aircraft Company, Los Angeles, Calif.

[21] Appl. No.: 905,965

[22] Filed: Jun. 29, 1992

Related U.S. Application Data

[63] Continuation-in-part of Ser. No. 714,493, Jun. 13, 1991, abandoned.

[51] Int. Cl.[5] .............................. H04J 1/05; H04J 4/00
[52] U.S. Cl. .................................... 370/120; 370/70; 370/50
[58] Field of Search ................ 370/120, 123, 70, 50; 455/131, 168.1, 188.1, 190.1, 313; 375/103

[56] References Cited

U.S. PATENT DOCUMENTS

| | | | |
|---|---|---|---|
| 4,785,447 | 11/1988 | Ichiyoshi | 370/70 |
| 4,881,222 | 11/1989 | Goeckler et al. | 370/70 |
| 4,884,265 | 11/1989 | Schroeder et al. | |
| 5,058,107 | 10/1991 | Stone et al. | |

OTHER PUBLICATIONS

Dieter Baecher, "Society of Automotive Engineers Technical Paper Series", International Congress and Exposition, 1986, pp. 77–84.
J. Ashaee, "Ashtech XII GPS Receiver", IEEE International Position Location & Navigational Symposium, Nov. 28, 1988.

*Primary Examiner*—Douglas W. Olms
*Assistant Examiner*—Min Jung
*Attorney, Agent, or Firm*—Georgann S. Grunebach; Terje Gudmestad; W. K. Denson-Low

[57] ABSTRACT

A digital receiver apparatus and method, designed for multiple simultaneous users, digitizes a received analog RF signal and performs multiple frequency translations of the signal so that desired stations are grouped into a common frequency band separate from the remaining stations. This frequency band is then isolated, and the individual selected stations are digitally separated, demodulated and processed to provide multiple simultaneous outputs. The frequency translations are preferably performed initially on a time multiplexed basis. Isolated station separation is performed either by time multiplexing, or by the use of multiple phase or tan locked loops.

28 Claims, 4 Drawing Sheets

MULTIPLE USER DIGITAL RECEIVER APPARATUS AND METHOD WITH COMBINED MULTIPLE FREQUENCY CHANNELS

RELATED APPLICATION

This application is a continuation-in-part of Ser. No. 07/714,493, filed Jun. 13, 1991 now abandoned.

BACKGROUND OF THE INVENTION

1. Field of the Invention

This invention relates to digital RF receivers, and more particularly to digital receiving systems and methods capable of simultaneously servicing multiple users.

2. Description of the Related Art

Conventional automobile radio systems have amplitude modulation (AM) and frequency modulation (FM) capabilities. Many automobiles are also equipped with cellular radios for both reception and transmission. Additional services that utilize other portions of the electromagnetic spectrum and are either currently being implemented, or are expected to be implemented in the future, include facsimile, computer, and global positioning system (GPS) services.

Reception of the various services is complicated by a desire to accommodate multiple simultaneous users. For example, it is desirable to have a capacity for cellular telephone calls at the same time the radio is playing on either AM or FM. It is also anticipated that different users will be able to plug into the communication system at the same time, such as by separate headphones assigned to different passengers, with each passenger having the ability to receive his or her own radio station while the other passengers are listening to their individual stations, using the cellular phone, etc.

The different broadcast bands are very dissimilar in terms of their bandwidths, modulation technology and band operation. The conventional approach to receiving multiple channels over multiple bands is to simply provide multiple receivers, with a separate receiver assigned to each band. If a capability for multiple simultaneous use of a single band is desired, multiple receivers are dedicated to that one band. Each additional receiver carries a penalty in terms of cost, weight, power and space requirements.

Digital receivers have been perceived as a way to accommodate very dissimilar types of modulations with a single receiver mechanism, eliminating the need for different types of receivers for each different service band. Since the channel selection frequency tuning, channel isolation and demodulation are all accomplished digitally, only a single digital receiver path is required for all of these functions. The transition between different broadcasting formats and bandwidths is accomplished by simply changing filter coefficients in the digital filters and the demodulation algorithms in a programmable demodulator. Such a system is envisioned in U.S. Pat. No. 5,058,107, by Stone et al., issued Oct. 15, 1991 and assigned to Hughes Aircraft Company, the assignee of the present invention, the contents of which patent are incorporated herein by reference. While the co-pending patent application achieves a significant reduction in system complexity and cost by using common digital computation for the different service bands, it can provide service to only one user at a time. Multiple receivers would therefore be necessary to service multiple simultaneous users.

Another digital receiver is disclosed in a paper by Dieter Baecher, "Society of Automotive Engineers Technical Paper Series", *International Congress and Exposition,* Detroit, Paper No. 861039, 1986, pages 77–84. An IF (intermediate frequency)-sampled, rather than RF-sampled, digital receiver is discussed. It processes only one received signal at a time; multiple IF sampled digital receivers would be necessary to process multiple signals.

A digital receiver that is capable of handling certain kinds of multiple signals simultaneously is disclosed in J. Ashjaee, "Ashtech XII GPS Receiver", *IEEE International Position Location & Navigation Symposium,* Nov. 28, 1988. However, this system is not applicable to common services such as FM, AM or cellular. It is designed for systems such as GPS in which all channels are broadcast at the same frequency, but are provided with different codes. The receiver processes multiple signals by code division multiplexing.

In U.S. Pat. No. 4,884,265 to Schroeder et al., assigned to Loral Corporation, a frequency division multiplexed input signal is digitized. The digitized samples are translated in frequency by mixing with baseband frequency signals to yield real and imaginary values that correspond to phase information in the original modulation signals. After translation, the samples are filtered in real and imaginary digital filters. The original modulation information is then recovered by analysis of the positions of vectors in the complex plane represented by the real and imaginary values. The translation is preferably performed by multiplying the input samples by digital values which correspond to sine and cosine values of local oscillator signals at baseband frequencies. The use of pre-select filtering prior to translation to decimate the input signals, and thereby reduce subsequent processing requirements, is suggested. While it is an improvement in digital receiver design, the system disclosed in this patent again does not resolve the problem of handling multiple simultaneous uses.

SUMMARY OF THE INVENTION

The present invention is for a digital method and apparatus for receiving and processing RF signals such that multiple simultaneous access to different signal frequencies within the overall signal is provided, either within a common service band or spread over different service bands that are separated in frequency. Relatively inexpensive hardware requirements that avoid the multiple capacity requirements encountered in prior systems is also sought.

To accomplish these goals, a received RF signal is digitized and subjected to multiple frequency translations by means of digital tuning so that each of a desired plurality of subbands is translated into a discrete portion of a selected frequency band. The results of the frequency translations are combined into a composite signal within the selected frequency band, which is isolated by an IF filter. The desired frequency subbands are then digitally separated, demodulated and processed to provide multiple outputs from the single receiver.

The frequency translations are preferably performed by offset tuning to the desired subbands on a time multiplexed basis, with the resulting multiplexed signals combined by decimating the data rate. The subbands can be separated either by time multiplexing, or by tuning multiple demodulator loops to the respective subbands. When time multiplexing is employed, a multiple finite impulse response (FIR) filter can be used that has a different FIR filter coefficient memory for each different service band to be processed. The use of multiple demodulator loops accomplishes subband separation and demodulation in a single step; phase locked loops are preferred for this purpose.

The system provides separate simultaneous outputs, with a different output for each user. These and other features and advantages of the invention will be apparent to those skilled in the art from the following detailed description, taken together with the accompanying drawings, in which:

DETAILED DESCRIPTION OF THE INVENTION

While the invention is applicable to numerous different types of RF service, it will be explained primarily in connection with FM. However, it should be understood that it can also be used for other services by themselves, or to combine different types of services for multiple simultaneous reception.

Figure 1:
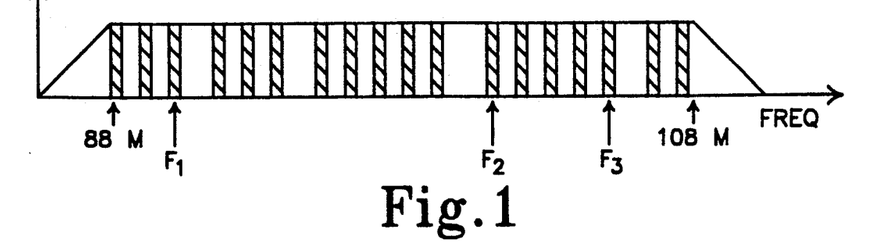
FIG. 1 is a frequency plot of a typical FM spectrum.
Figure 2:
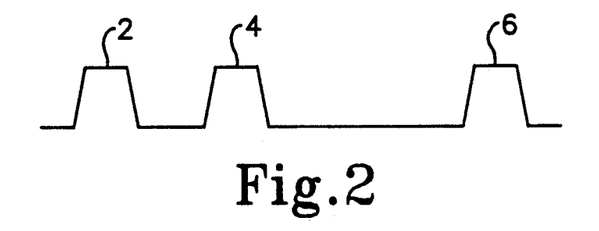
FIG. 2 is a frequency plot illustrating the gaps between adjacent FM stations.

FIG. 1 is a frequency plot illustrating three desired station subbands centered about frequencies $F_1$, $F_2$ and $F_3$ within a typical FM spectrum. FM has a broadcast band of 87.9–107.9 MHz, with 200 KHz station subband bandwidths and 400 KHz station spaces. Adjacent station slots are separated from each other by frequency gaps. If an allocated station frequency is not occupied by an active station in a given area, there will be an additional gap between the stations on either side. Such additional gaps are illustrated to the right of frequencies $F_1$ and $F_3$, and to the left of $F_2$. The situation is shown in somewhat greater detail in FIG. 2, in which three active station subbands 2, 4 and 6 are shown plotted against frequency. The maximum amplitude of each station occupies about 150 KHz, while the bandwidth at their bases is 200 KHz. Stations 2 and 4 are shown occupying immediately adjacent station slots, while stations 4 and 6 are separated by an intermediate unoccupied station slot. Thus, there is a deadband of about 200 KHz between stations 2 and 4, and a deadband of about 600 KHz between stations 4 and 6. The invention makes use of these empty bands to provide multiple simultaneous reception service for different frequencies.

With the aid of these deadbands, the invention groups different desired station subbands together, isolates them from the remainder of the RF signal, separates the isolated station signals, demodulates them, and performs audio processing so that they are available for multiple user service. The preferred way to accomplish the desired subband grouping and isolation uses a modification of a digital IF receiver disclosed in connection with single-station reception in U.S. Pat. No. 5,058,107 referenced above. In this patent a digital complex mixer is responsive to a received digital RF signal to output a desired station subband centered at zero frequency. This output is processed by a digital lowpass filter that isolates the desired filtered subband. A digital complex mixer that is responsive to the filtered subband then translates the selected channel to a predetermined IF frequency.

Figure 3:
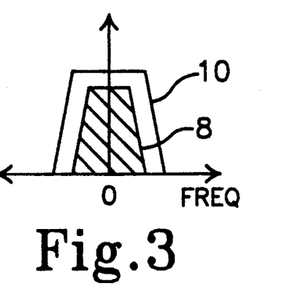
FIG. 3 is a frequency plot illustrating the channel isolation achieved with a digital IF filter that is preferred for the invention.

The results of this filtering process are illustrated in FIG. 3. An FM station 8 is shown with hatched lines, while the channel isolation provided by the IF filter is indicated by envelope 10 which segregates subband 8 from the remainder of the received signal.

The invention makes use of this type of filter to isolate not one, but multiple desired frequency subbands. This is preferably accomplished on a time multiplexed basis, with the different subbands initially separated from each other in time, but it could also be implemented by providing parallel station isolation paths, with each path dedicated to a different desired subband. Although the technique disclosed in U.S. Pat. No. 5,058,107 is preferred, other ways of grouping desired subbands together and isolating them from the remainder of the received signal may also be employed.

Figure 4A:
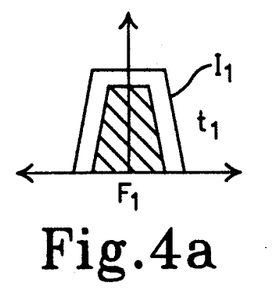
FIGS. 4a and 4b are frequency plots showing the results of time multiplexing and IF filtering an input RF signal at two different mixed frequencies $F_1$ and $F_2$.
Figure 4B:
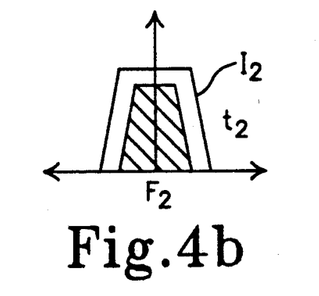

FIGS. 4a and 4b illustrate the present time multiplexing approach to grouping and isolating desired station subbands; these subbands will generally initially be separated from each other at different parts of the FM spectrum. At a first instant of time $t_1$, the receiver is tuned to the first desired subband centered at $F_1$. This causes the received signal to be translated in frequency so that $F_1$ is centered on zero. After filtering, this subband is isolated from the remainder of the received signal by an isolation envelope $I_1$ (FIG. 4a). In the next instant of time, $t_2$, the receiver is tuned to $F_2$. This translates the received signal so that $F_2$ and its subband are centered on zero; after filtering, these frequencies are isolated from the remainder of the signal by an isolation envelope $I_2$ (FIG. 4b). If more subbands are desired, the system is tuned to their center frequencies in turn as the multiplexing continues. Otherwise, the tuning continues to oscillate back and forth between $F_1$ and $F_2$.

If the two isolated subbands about $F_1$ and $F_2$ are superimposed upon each other, they will overlap and interfere. Assume now, however, that the system is tuned not to $F_1$ and $F_2$ directly, but to the opposite edges of their respective subbands ($F_1-100$ KHz and $F_2+100$ KHz). This translates $F_1$ to $+100$ KHz and $F_2$ to $-100$ KHz. If the subbands are then combined, they appear as in FIG. 5, with the $F_1$ subband immediately to the right of zero and the $F_2$ subband immediately to the left. Then, by adjusting the IF filter so that it produces an isolation envelope $I_{1,2}$ that spans 400 KHz, the $F_1$ and $F_2$ subbands can be isolated from other stations 12 in the input signal. This is the theory upon which the present invention operates. In effect, station $F_1$ is translated into a deadband adjacent station $F_2$, and vice versa.

Figure 6:
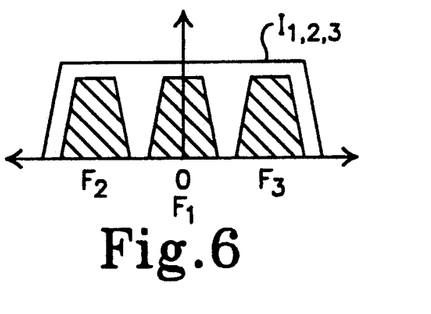
FIG. 6 is a frequency plot of three desired frequency subbands about $F_1$, $F_2$ and $F_3$, isolated from an RF signal.

This concept can be extended to three stations, as illustrated in FIG. 6. In this configuration three desired stations, centered respectively upon frequencies $F_1$, $F_2$, and $F_3$, are translated into discrete portions of a common isolation envelope $I_{1,2,3}$. This isolation characteristic is achieved with a triple width IF filter. The digital mixer is tuned via time multiplexing so that $F_1$ is mixed to zero, $F_2$ is mixed to $-200$ KHz, and $F_3$ is mixed to $+200$ KHz.

Figure 7:
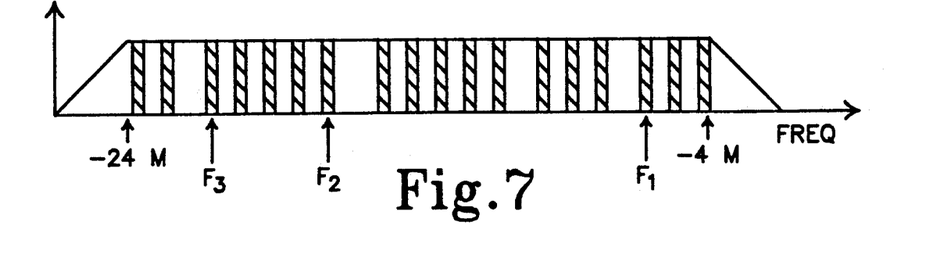
FIG. 7 is a frequency plot of an imaged FM spectrum.

The three station technique is possible only if there happens to be a double gap (a vacant station slot) next to each of the two stations that are translated to the outer portions of the isolation envelope. However, the double gap can be on either side of the two stations. If both gaps are on the same side, the image station can be mixed so that the gap is reversed. A plot of a negative frequency FM image spectrum, which is the mirror image of the positive frequency FM spectrum of FIG. 1, with gaps on the opposite sides of the positive images shown in FIG. 1, is illustrated in FIG. 7.

An absolute double gap is not required for triple signal mixing. It is enough if the power of a station adjacent a desired station is about 6–10 dB less than that of the desired station. As determined by the FM capture ratio, the FM demodulator will greatly attenuate the lower power signal so that it can effectively be ignored. Gaps at desired frequency locations can effectively be "manufactured" by attenuating the entire FM band so that the weaker station at the desired gap location becomes subject to the FM capture ratio. Attenuation is accomplished in the digital domain by shifting the station's digital bits to less significant bit locations. This attenuation technique is applicable to FM and digital modulation services, but not to AM.

Figure 8:
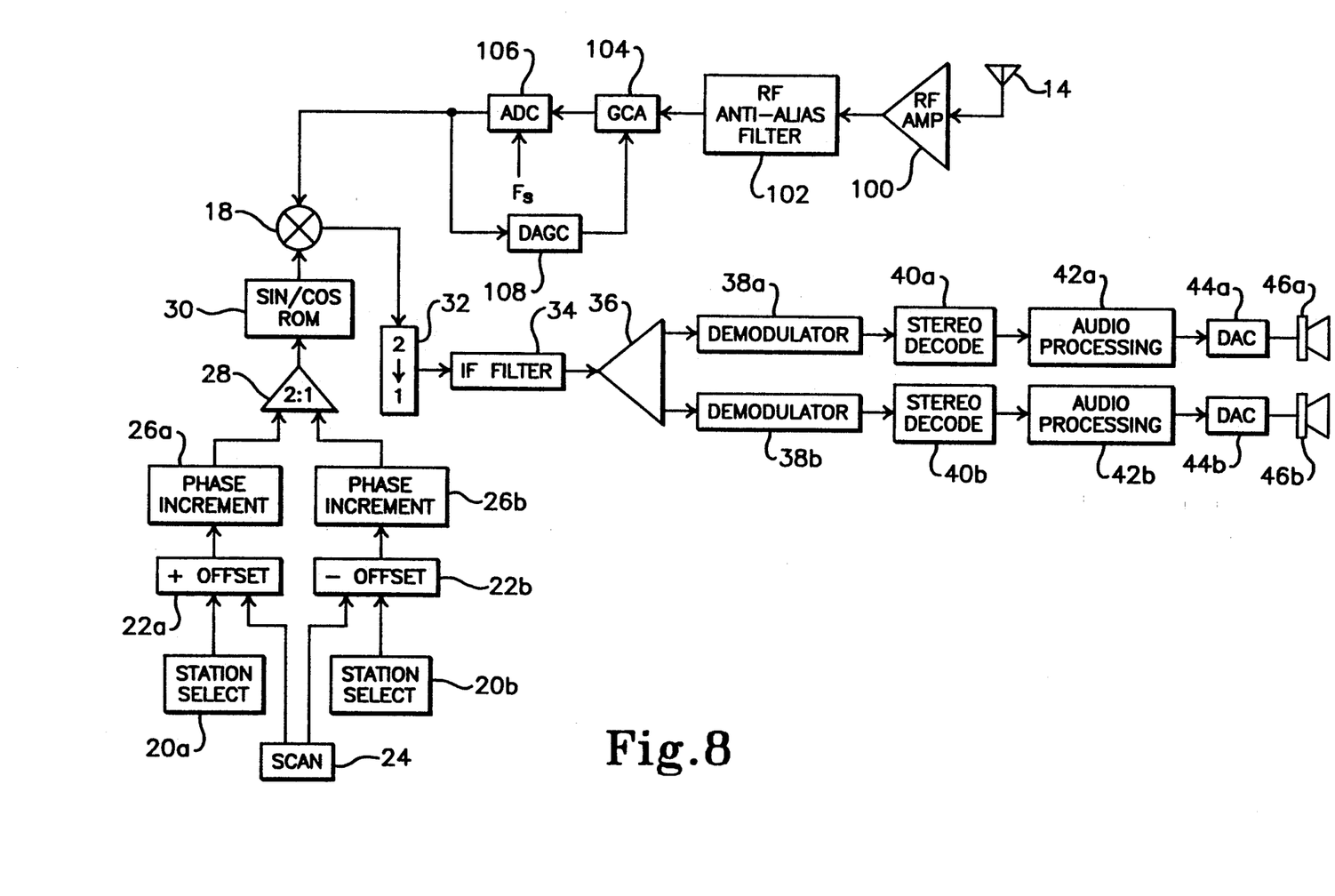
FIG. 8 is a block diagram of a preferred embodiment of the invention.

A preferred system for implementing the invention is shown in FIG. 8. An antenna 14 receives the RF broadcast signal; this may be implemented as a collection of separate antennas if the multiple simultaneous reception of different service bands is desired. An RF amplifier 100 receives signals within a predetermined signal band from the antenna 14. The output of the RF amplifier 100 is provided to an RF anti-alias filter 102 which provides its filtered RF output to a gain controlled amplifier (GCA) 104 which can be of known design. The output of the GCA 104 is provided to a high speed precision analog-to-digital converter (ADC) 106 which provides a sampled received signal.

The GCA 104 is controlled by a periodically updated feedback digital control word provided by a digital automatic gain control (DAGC) processor 108 which is responsive to the output of the ADC 106. The DAGC process 108 can also be of known design and includes peak detection circuitry and control word generating circuitry. The control word is converted to a stable analog current which is utilized to control the gain of the GCA 104.

The characteristics of the RF anti-alias filter 102 would depend on the specific application and requirements, and preferably should have very close to linear phase and should have minimum loss. Generally, the RF anti-alias filter 102 has an appropriate passband, defined at an appropriate attenuation level such as $-3$ dB, which extends from the lowest frequency to the highest frequency of the band of interest. Outside of the passband, the location of the stopband edges, defined at an appropriate rejection level such as $-100$ dB, would depend on the ADC sampling rate to the degree that the filter skirts (i.e., the regions between a passband edge and the adjacent stopband edge) from aliased spectral images do not encroach upon the passband of the desired spectral image.

The full bandwidth covered by AM, FM and cellular (0.540–895 MHz) is generally too wide to be handled by a single ADC of current design. However, a translation of the service bands so that they occupy adjacent portions of the spectrum is proposed in a co-pending application by Kelley (the present inventor) and Kosaka, the contents of which are incorporated herein by reference, "Multi-band Digital Receiving Apparatus and Method with Bandwidth Reduction", Ser. No. 714,494, filed Jun. 13, 1991 and also assigned to Hughes Aircraft Company. If the service band translation technique suggested in the co-pending application is used, a single ADC may be employed for all three service bands. Otherwise, a separate ADC may have to be provided for each service band.

The ADC's sample rate will depend upon (a) whether baseband or passband sampling is utilized, (b) the signal information bandwidth and/or maximum signal frequency, and (c) aliased image location. Baseband sampling requires a sample rate that is at least twice as high as the highest instantaneous frequency contained in the signal being sampled. Bandpass sampling allows for a sample rate that is less than the frequency of the lower bandedge, so long as the sample rate is at least twice the bandwidth of the RF signal. Further information on preferred sampling rate is provided in U.S. Pat. No. 5,058,107.

Multiple-user station selection is provided by a multiple simultaneous tuner consisting of a modified programmable direct digital frequency synthesizer. The tuner provides mixing frequency signals on a time multiplexed basis to a complex multiplier 18, where they are mixed with the digitized signal from ADC 16 to translate the signal spectrum as described in connection with FIGS. 4a-5. The tuner includes station selection mechanisms 20a, 20b for each user to select his or her desired AM or FM station; a station select may also be dedicated to another service, such as cellular phone. A separate station select is provided for each different user; a mechanism for dual users is illustrated in FIG. 8.

Figure 5:
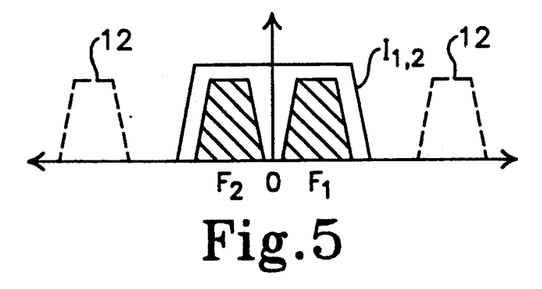
FIG. 5 is a frequency plot of the two frequency subbands $F_1$ and $F_2$ isolated from the remainder of an RF signal in accordance with the invention.

The selected station subbands are offset from their center frequencies, as illustrated in FIG. 5, by digital offset generators 22a and 22b. Initially, a gap that is large enough to contain the desired number of selected stations is located by high speed scanning across the FM bandwidth with scanner 24, if more than two simultaneous stations are desired. The selected subband frequencies are then offset with respect to the center of the located gap. If only two simultaneous stations are desired, the edge of either one can be used as the center mix frequency because there will always be at least a single frequency gap on either side of a station.

Respective phase incrementors 26a, 26b for each selected station are implemented as accumulators and generate a staircase of phase values that approximate a ramp, at frequencies determined by the applicable phase increments of the offset selected station frequencies. To maintain coherence among the multiple frequencies, the phase accumulation for each one performed in a separate accumulator. However, phase increment registers and accumulators require only relatively minor amounts of additional hardware.

The outputs of the phase increment accumulators 26a, 26b are time multiplexed by a multiplexer 28, which interlaces the signals in time on a single line. The output of multiplexer 28 is applied to a sine/cosine read only memory (ROM) 30 that stores codes which translate the values accumulated in the accumulators 26a, 26b to digitized sine and cosine outputs, and are the real and quadrature components of the digital synthesized frequency. The output sinusoidal waves will preferably have about 14 bit accuracy requiring approximately $2^{16}$ entries in the ROM. The sampled digital sine and cosine outputs have the same frequencies as the offset carrier frequencies of the selected stations to be tuned. The sine/cosine table lookup ROM is clocked at a higher frequency than the phase incrementors to generate multiple frequency words. For example, assuming the use of two phase incrementors that are each clocked at a 10 MHz rate, the sample rate at which the sine/cosine ROM 30 is addressed will be 20 MHz.

The output of the sine/cosine ROM 30 is applied to the complex multiplier 18, where it is mixed with the digitized input signal from ADC 16. Complex mixing is utilized because this allows the entire spectrum to be shifted in one direction, as distinguished from "real" mixing (i.e., where only one multiplication is utilized) which can result in distortion producing overlapping images. As is well known, real mixing produces four images of the original positive and negative spectral images.

The time multiplexed complex outputs of the digital complex mixer (multiplier) 18 are combined into a composite signal in a decimator 32 that reduces the data rate by a factor equal to the number of different simultaneously selected stations. For the present example of two simultaneous stations, decimator 32 reduces the data rate by 2:1.

The composite signal is next processed by a digital lowpass IF filter 34, preferably of the type described in the Stone et al. application. The output of this filter corresponds to the isolated IF signal shown in FIG. 5, in which only the desired station subbands are within the isolation envelope $I_{1,2}$. The two station subbands are then separated by a signal separator 36. A number of different implementations of this function may be used, and are discussed in detail below.

The separated station subbands are next demodulated and audio processed. Preferably a single digital signal processor (DSP) is used for all of the stations. The Texas Instruments TMS320C30 DSP is suitable for this purpose. The signal processor software used for FM demodulation and audio processing (including stereo decode) requires less than 10,000,000 instructions per second (MIPS), whereas the TMS320C30 DSP is capable of about 33 MIPS. Thus, up to three separate stations can be processed jointly.

The digital processing system downstream of the signal separator 36 consists of digital demodulators 38a, 38b that remove the carrier signals from their respective decimated inputs, stereo decoders 40a, 40b that separate the left and right stereo signals for each separate station, digital audio processors 42a, 42b that condition the signals with functions such as tone control, volume control, etc., and digital-to-analog converters (DACs) 44a, 44b that convert the processed digital signals to analog format; the DACs may be considered to be part of the audio processor function. After appropriate amplification (not shown), the analog signals are connected to operate respective speakers 46a, 46b or other desired output devices.

The digital demodulation, stereo decode and audio processing functions are conventional for a single channel, and are discussed for example in the Dieter Daecher reference mentioned above. By time-sharing its throughput, the programmable DSP operates upon the data stream for each selected station independently. In this manner, a single processor can be used to demodulate, decode and audio process a number of distinct station simultaneously. If the multiple signal paths in the programmable DSP are for different service bands, different demodulation algorithms are required for each band. When only a single service band is being received, such as FM, a common algorithm may be used for each selected station.

Figure 9:
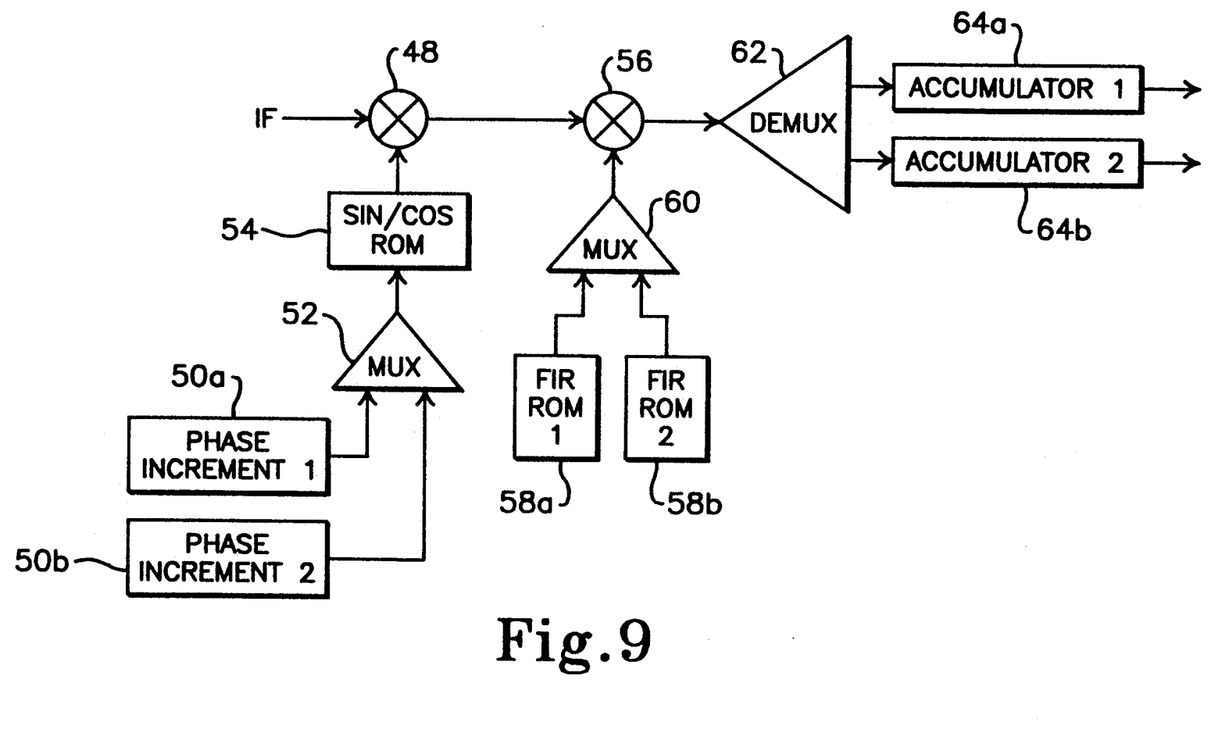
FIG. 9 is a block diagram showing one implementation of a subband separator used in the system of FIG. 8.

FIG. 9 illustrates one approach to implementing the signal separation function 36. The IF output of filter 34 is applied to a complex multiplier 48. In this embodiment final station isolation is achieved by tuning to each of the multiple stations, and forming a channel isolation filter. Tuning is accomplished by time multiplexing, in a manner similar to the tuning initially used to align the selected station subbands as an input to IF filter 34 in FIG. 8. The outputs of phase incrementors 50a, 50b, which are set to the desired station subbands, are time-multiplexed by a multiplexer 52 and used to generate appropriate time-multiplexed digital tuning signals from sine/cosine ROM 54. These signals are then mixed with the input IF signal in complex multiplier 48. The complex output of the digital complex mixer (multiplier) 48 is applied to another complex multiplier 56 that forms part of a finite impulse response (FIR) filter. This filter serves as a bandpass filter for each of the multiplexed service bands. Separate FIR ROMs 58a, 58b store FIR coefficients for each separate service band. When only a single service band is used, such as when all users are tuned to different FM stations, only a single FIR ROM with FM coefficients is required. The number of coefficients per ROM will vary according to the original sample rate in the final data rate, but generally will fall within the range of about 20–200.

The FIR ROMs are addressed in a time multiplexed fashion by a multiplexer 60. The digital IF signals are multiplied by the FIR ROM coefficients in complex multiplier 56. The results of this multiplication are separated into discrete data streams for each selected station by demultiplexer 62, and forwarded to respective accumulators 64a, 64b for each selected station. Each successive input datum to complex multiplier 56 is multiplied by a successive coefficient for its corresponding service band, with the accumulators 64a, 64b for each selected station adding the results of the multiplication for its respective input signal. The data rate output from the accumulators is thus decimated by a factor equal to the number of FIR coefficients with respect to the sample rate of its input IF signal. The accumulator outputs represent the segregated signals for the selected stations, which are then delivered to the demodulation station.

The signal sample rate at the output of IF filter 34 is reduced from that of the RF input by a factor on the order of 1,000:1, yielding an IF sample rate that is generally about several hundred KHz. At this relatively low sample rate it is practical to implement the tuner/filter of FIG. 9 in software.

Figure 10:
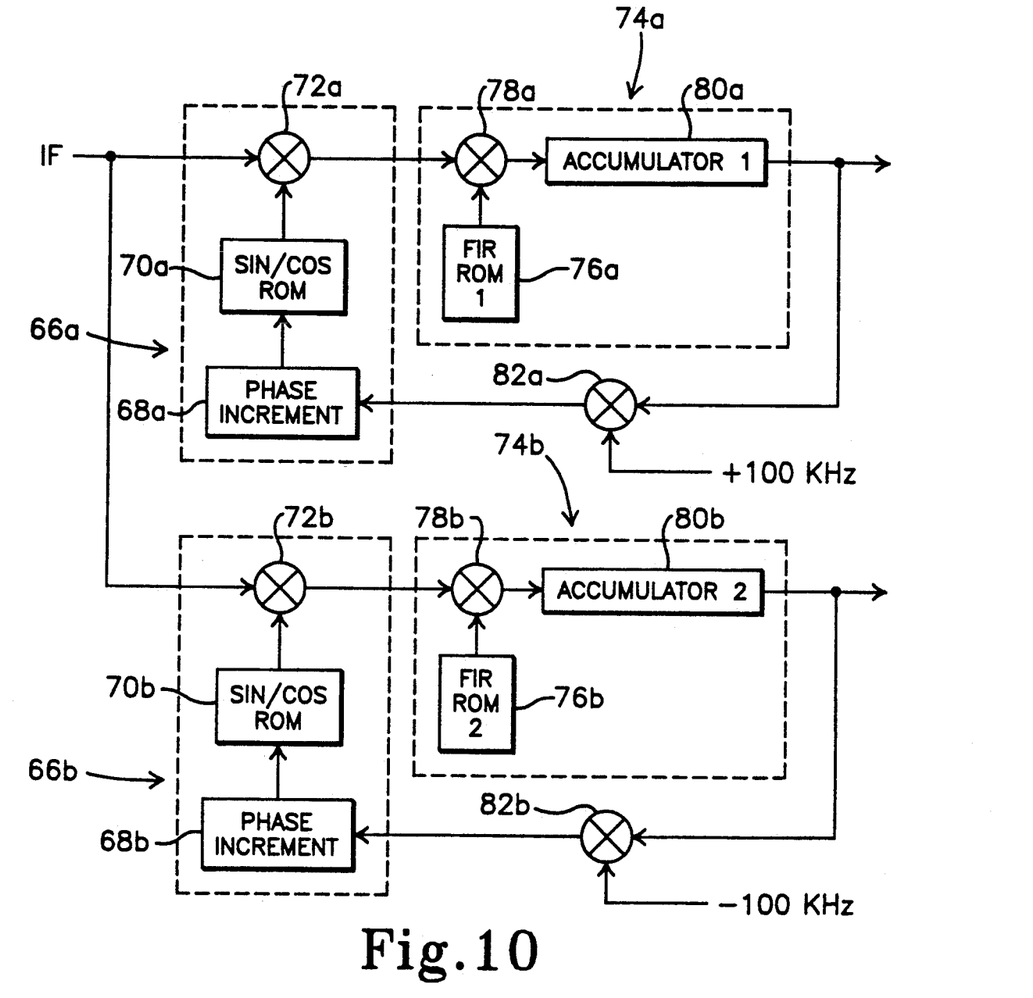
FIG. 10 is a block diagram of an alternate subband separator that combines a demodulation function.

An alternate approach to signal separation that combines this signal separation with demodulation is shown in FIG. 10. This system employs a digital phase locked loop, with the loop bandwidth used for channel isolation as well as demodulation. Digital tan (tangent) locked loops could be used instead of phase locked loops. The system shown in FIG. 10 is applicable to FM service only. If other service bands are simultaneously processed, they would require separate demodulators.

A separate loop is provided to separate and demodulate each selected FM station subband. The first loop includes a numerically controlled oscillator 66a that is set to the frequency of the first selected station. The numerically controlled oscillator 68a includes a phase incrementor 66a and a sine/cosine ROM 70a, the output of which is multiplied by the input IF signal in a complex multiplier 72a. The resulting selected station signal is then processed by a FIR filter 74a. This filter consists of a FIR ROM 76a that contains FM coefficients, a complex multiplier 78a that multiplies the station signals from the numerically controlled oscillator by the FIR ROM coefficients, and an accumulator 80a that accumulates the results of the multiplication. The demodulated station output of accumulator 80a can be presented directly to the stereo decoder 40a (FIG. 8).

It will be recalled that the input station signal to the phase locked loop is offset by 100 KHz, for the case of two simultaneously selected stations. Where three stations are simultaneously selected, the offsets are +200 KHz, −200 KHz and zero. A compensating offset frequency is introduced through adder 82a, which receives the output of accumulator 80a and delivers it along with the added compensating offset frequency to the phase incrementor 68a of numerically controlled oscillator 66a.

A similar phase locked loop is provided for each additional station for which simultaneous reception is desired. A second such loop is indicated in FIG. 10. Common reference numbers are used to identify the elements that are the same as in the first loop, but include the suffix "b". In the second loop, the 100 KHz offset is the negative of the offset in the first loop. As with the tuner/filter approach of FIG. 9, the relatively low IF data rates allow the separator/demodulator of FIG. 10 to be implemented entirely in software.

Figure 11:
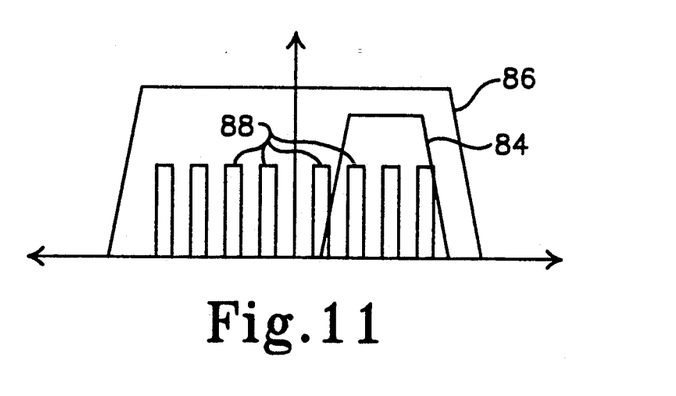
FIG. 11 is a frequency plot showing the invention applied to simultaneous AM and FM reception.

If simultaneous AM and FM reception is desired, a separate AM demodulator is required. AM stations are much more closely bunched along the RF spectrum than are FM stations. This can result in the situation illustrated in FIG. 11, in which a desired FM station 84 has been translated to the right hand side of a filter isolated waveband 86, with the FM station's adjacent deadband on the opposite side of the isolation band. However, whereas only a single FM station will fit into the isolation band 86, numerous AM stations 88 can be included when a desired AM station is frequency translated to the left hand portion of the isolation band. To handle this situation, a separate tuner-filter can be used to segregate the desired AM station from the other AM stations in the FM deadband area. The AM stations 88 that overlap the FM station band 84 function similar to single tones in the FM demodulator, and will generally be rejected during FM demodulation.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A digital receiver for multiple simultaneous users, comprising:

means for digitizing an input radio frequency (RF) signal, means for digitally tuning to a plurality of desired frequency subbands within said input signal so that said desired subbands are offset from each other within a selected frequency band, means for digitally isolating said selected frequency band from the remainder of said input signal, and means for digitally separating, demodulating and processing said desired frequency subbands from said isolated frequency band to provide multiple outputs from said receiver.

2. The digital receiver of claim 1, wherein said selected frequency band substantially excludes other portions of said input signal.

3. The digital receiver of claim 1, wherein said digital tuning means tunes to said desired frequency subbands on a time multiplexed basis.

4. The digital receiver of claim 3, said digital tuning means including signal decimating means for combining said time multiplexed frequency subbands.

5. The digital receiver of claim 1, said means for separating said desired frequency subbands comprising means for time multiplexing said subbands.

6. The digital receiver of claim 5, said means for separating said desired frequency subbands further comprising a finite impulse response (FIR) filter means that includes means for processing said desired subbands with corresponding FIR filter coefficients.

7. The digital receiver of claim 6, for an input RF signal comprising separate RF service bands that are spaced from each other in frequency, said FIR filter means comprising a plurality of FIR filter coefficient memories corresponding to respective service bands, means for digitally time multiplexing among said FIR filter coefficient memories, and means controlling said FIR filter coefficient memory multiplexing in synchronism with the multiplexing of said desired frequency subbands so that the desired subbands for each service band are processed by a corresponding FIR filter coefficient memory for that service band.

8. The digital receiver of claim 1, said means for separating and demodulating said desired frequency subbands comprising multiple demodulator loops, and means tuning each loop to a respective desired subband within said selected frequency band.

9. The digital receiver of claim 8, said demodulator loops comprising respective phase locked loops.

10. The digital receiver of claim 1, said means for digitally isolating said selected frequency band comprising a digital intermediate frequency (IF) filter.

11. A digital receiver for multiple simultaneous users, comprising:

means for digitizing an input radio frequency (RF) signal, means for performing multiple frequency translations of said RF signal relative to a selected frequency band so that, for each translation, a respective desired frequency subband of said RF signal occupies said selected frequency band substantially exclusive of the other portions of said RF signal, intermediate frequency (IF) digital filter means for isolating said selected frequency band, and means for digitally separating, demodulating and processing said desired frequency subbands from said isolated band to provide multiple outputs from said receiver.

12. The digital receiver of claim 11, said multiple frequency translating means comprising digital time multiplexed tuning means for tuning to said desired subbands of said input RF signal on a time multiplexed basis.

13. The digital receiver of claim 12, said digital tuning means including signal decimating means for combining said time multiplexed frequency subbands within said baseband.

14. The digital receiver of claim 11, said means for separating said desired frequency subbands comprising means for time multiplexing said subbands.

15. The digital receiver of claim 14, said means for separating said desired frequency subbands further comprising a finite impulse response (FIR) filter means that include means for processing said desired subbands with corresponding FIR filter coefficients.

16. The digital receiver of claim 15, for an input RF signal comprising separate RF service bands that are spaced from each other in frequency, said FIR filter means comprising a plurality of FIR filter coefficient memories corresponding to respective service bands, means for digitally time multiplexing among said FIR filter coefficient memories, and means controlling said FIR filter coefficient memory multiplexing in synchronism with the multiplexing of said desired frequency subbands so that the desired subbands for each service band are processed by a corresponding FIR filter coefficient memory for that service band.

17. The digital receiver of claim 11, said means for separating and demodulating said desired frequency subbands comprising multiple demodulator loops, and means tuning each loop to a respective desired subband within said selected frequency band.

18. The digital receiver of claim 17, said demodulator loops comprising respective phase locked loops.

19. A digital reception method for an RF signal having multiple desired frequency subbands, comprising:
digitizing said RF signal,
performing multiple frequency translations of said digitized signal to translate each of said desired subbands into discrete portions of a selected frequency band,
digitally filtering said digitized RF signal after said frequency translations to isolate said frequency band, and
digitally separating, demodulating and processing said desired frequency subbands from said isolated selected band to provide multiple outputs from said receiver.

20. The method of claim 19, wherein the results of said frequency translations are combined to form a composite selected frequency band prior to said digital filtering.

21. The method of claim 19, wherein said multiple frequency translations are performed on a time multiplexed basis.

22. The method of claim 21, wherein said time multiplexed desired subbands are combined into a composite subband prior to said digital filtering.

23. The method of claim 19 wherein, for each of said frequency translations, said selected frequency band is occupied substantially solely by a respective desired frequency subband.

24. The method of claim 23, further comprising the step of attenuating undesired frequency components of said RF signal within said selected frequency band.

25. The method of claim 19, wherein undesired frequency components of said RF signal as well as a desired subband are translated into said selected frequency band, said subband separating step including the step of digitally tuning to said desired subbands within said selected band exclusive of said undesired frequency components.

26. The method of claim 19, wherein said desired frequency subbands are separated by time multiplexing.

27. The method of claim 19, wherein said desired frequency subbands are separated and demodulated by processing said isolated selected frequency band in multiple demodulator loops tuned to respective desired frequency subbands.

28. The method of claim 19, wherein said digitized RF signal is decimated to an intermediate frequency (IF) level during said digital filtering step.

* * * * *